United States Patent
Corisis et al.

(10) Patent No.: US 7,372,138 B2
(45) Date of Patent: May 13, 2008

(54) ROUTING ELEMENT FOR USE IN MULTI-CHIP MODULES, MULTI-CHIP MODULES INCLUDING THE ROUTING ELEMENT AND METHODS

(75) Inventors: David J. Corisis, Meridian, ID (US); Jerry M. Brooks, Caldwell, ID (US); Matt E. Schwab, Boise, ID (US); Tracy V. Reynolds, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/080,586

(22) Filed: Mar. 15, 2005

(65) Prior Publication Data

US 2005/0156293 A1 Jul. 21, 2005

Related U.S. Application Data

(63) Continuation of application No. 09/942,183, filed on Aug. 29, 2001, now Pat. No. 6,882,034.

(51) Int. Cl.
*H01L 23/02* (2006.01)

(52) U.S. Cl. .............................. 257/685; 257/E23.117

(58) Field of Classification Search .................. None
See application file for complete search history.

(56) References Cited

U.S. PATENT DOCUMENTS

| | | | |
|---|---|---|---|
| 4,709,468 A | 12/1987 | Wilson | |
| 4,890,157 A | 12/1989 | Wilson | |
| 5,120,678 A * | 6/1992 | Moore et al. | 29/840 |
| 5,192,716 A | 3/1993 | Jacobs | |
| 5,245,216 A * | 9/1993 | Sako | 257/676 |
| 5,362,984 A * | 11/1994 | Konda et al. | 257/666 |
| 5,763,939 A * | 6/1998 | Yamashita | 257/668 |
| 5,805,422 A * | 9/1998 | Otake et al. | 361/749 |
| 6,002,168 A * | 12/1999 | Bellaar et al. | 257/696 |
| 6,028,365 A * | 2/2000 | Akram et al. | 257/778 |
| 6,072,233 A | 6/2000 | Corisis et al. | |
| 6,137,164 A | 10/2000 | Yew et al. | |
| 6,169,329 B1 | 1/2001 | Farnworth et al. | |
| 6,284,982 B1 | 9/2001 | Kusner et al. | |
| 6,333,549 B2 | 12/2001 | Drehobl et al. | |
| 6,376,279 B1 | 4/2002 | Kwon et al. | |
| 6,395,565 B1 * | 5/2002 | Akram et al. | 438/15 |
| 6,441,476 B1 * | 8/2002 | Emoto | 257/686 |
| 6,444,921 B1 | 9/2002 | Wang et al. | |

(Continued)

*Primary Examiner*—Leonardo Andujar
*Assistant Examiner*—Ben P Sandvik
(74) *Attorney, Agent, or Firm*—TraskBritt

(57) ABSTRACT

A routing element for use in a semiconductor device assembly includes a substrate that carries conductive traces that provide either additional electrical paths or shorter electrical paths than those provided by a carrier substrate of the semiconductor device assembly. The conductive traces may be carried upon a single surface of the routing element substrate, be carried internally by the routing element substrate, or include externally and internally carried portions. The routing element may also include a contact pad positioned at each end of each conductive trace thereof to facilitate electrical connection of each conductive trace to a corresponding terminal of the substrate or to a corresponding bond pad of a semiconductor device of the multichip module. Multichip modules are also disclosed, as are methods for designing the routing element and methods in which the routing element is used.

12 Claims, 3 Drawing Sheets

U.S. PATENT DOCUMENTS

| | | |
|---|---|---|
| 6,462,976 B1 | 10/2002 | Olejniczak et al. |
| 6,492,201 B1 * | 12/2002 | Haba .......................... 438/121 |
| 6,521,994 B1 | 2/2003 | Huse et al. |
| 6,521,995 B1 | 2/2003 | Akram et al. |
| 6,555,921 B2 | 4/2003 | Kwon et al. |
| 6,822,320 B2 | 11/2004 | Haba |
| 6,940,164 B1 * | 9/2005 | Yoshimatsu et al. ........ 257/725 |
| 2002/0039464 A1 | 4/2002 | Yoshimura et al. |
| 2002/0050633 A1 | 5/2002 | Matsumoto |
| 2002/0171144 A1 | 11/2002 | Zhang et al. |
| 2004/0164396 A1 | 8/2004 | Hashimoto |

* cited by examiner

ROUTING ELEMENT FOR USE IN MULTI-CHIP MODULES, MULTI-CHIP MODULES INCLUDING THE ROUTING ELEMENT AND METHODS

CROSS-REFERENCE TO RELATED APPLICATION

This application is a continuation of application Ser. No. 09/942,183, filed Aug. 29, 2001, now U.S. Pat. No. 6,882, 034, issued Apr. 19, 2005.

BACKGROUND OF THE INVENTION

1. Field of the Invention

The present invention relates generally to multichip modules (MCMs) that include substrates with a number of semiconductor devices positioned at different locations on the surfaces thereof and, more specifically, to multichip modules that include routing elements overlapping portions of the multichip module substrate or one or more of the semiconductor devices on the substrate. In particular, the present invention relates to a routing element that provides additional circuit traces and that may be used to decrease the lengths of circuit paths across a multichip module.

2. Background of Related Art

Multichip modules have been developed to combine the functionalities of two or more semiconductor devices on a single carrier substrate, such as a circuit board. Conventional multichip modules have included a relatively large carrier substrate with a number of different semiconductor devices occupying different regions on one or both sides thereof. The semiconductor devices may communicate with one another or be connected with terminals of the carrier substrate that, in turn, facilitate communication between the semiconductor devices of the multichip module and external electronic componentry. In either event, electrical signals are typically conveyed by circuit traces that are carried by the carrier substrate.

As the feature densities of semiconductor devices continue to increase, the number of bond pads on semiconductor devices may also increase. In addition, the ever-increasing feature densities of semiconductor devices may be accompanied by decreases in the size of semiconductor devices which, in turn, may result in multichip modules that include increased numbers of semiconductor devices, again increasing the number of bond pads for a particular carrier substrate. Thus, the carrier substrates of state of the art multichip modules must carry ever-increasing numbers of circuit traces to keep up with the ever-increasing numbers of bond pads for which the carrier substrate must provide electrical connections.

To accommodate additional circuit traces, additional conductive and dielectric layers are typically added to carrier substrates. The increase in the manufacturing cost of carrier substrates, however, does not increase a proportionate amount for each additional layer. Rather, while carrier substrates with four layers cost only about 50% more than two-layer carrier substrates, six-layer carrier substrates are about ten times as expensive as two-layer carrier substrates due to decreased yields. Similar cost increases accompany further increases in the complexity of carrier substrates. As additional layers are often added for the purpose of providing relatively few additional circuit traces, the increased cost of a carrier substrate with these additional layers is difficult to justify in this cost-competitive industry.

In addition, due to the ever-increasing numbers of circuit traces that are carried upon and within multichip module carrier substrates, the complexities and pathlengths of the circuit traces are also ever increasing in order to minimize electrical interference between traces.

Accordingly, there appears to be a need for apparatus to accommodate electrical connection of increasing numbers of bond pads without requiring an increase in the number of layers and, thus, the complexity of a multichip module carrier substrate. There also appears to be a need for apparatus that electrically connect mutually remote pads or terminals while providing the shortest possible pathlength therebetween.

SUMMARY OF THE INVENTION

The present invention includes a routine element that is configured to be disposed at least partially over a substrate of a multichip module or semiconductor devices carried upon the substrate. The routing element includes a thin, optionally flexible, dielectric film that carries circuit traces. The routing element may also include contact pads at the ends of each of the conductive traces. The routing element and substrate collectively form a carrier for one or more semiconductor devices of the multichip module.

A multichip module incorporating teachings of the present invention includes a substrate with die mounting regions on at least one side thereof. Semiconductor devices may be positioned on corresponding die mounting regions of the substrate. Terminals located adjacent to the die mounting regions of the substrate communicate with corresponding conductive traces that are carried upon the substrate. Terminals located at opposite ends of the conductive traces are configured to facilitate electrical connection of conductive traces and, thus, of semiconductor device input/output pads, or bond pads, that communicate with each of the conductive traces to other semiconductor devices, electronic components on the substrate, or components that are external to the multichip module.

In addition, the multichip module includes one or more routing elements. Routing elements may be positioned over the substrate, one or more of the semiconductor devices on the substrate, or some combination thereof to provide additional conductive traces through which electrical connections may be made. Accordingly, a first terminal of the multichip module substrate or a first bond pad of a semiconductor device of the multichip module may be electrically connected to a corresponding conductive trace of a routing element which, in turn, is electrically connected to a corresponding second terminal of the substrate or second bond pad of the same or a different semiconductor device, thereby establishing communication between the first terminal or bond pad and the second terminal or bond pad.

The path of a circuit trace of a routing element according to the present invention may be substantially linear and, thereby, provide a shorter conductive pathlength, or more direct route, from the first terminal or bond pad to the second terminal or bond pad than would a conventional conductive trace carried by the substrate of the multichip module.

An electrical connection method employing teachings of the present invention includes substantially simultaneously providing conductive paths for electrical communication between a first plurality of terminals and bond pads and corresponding terminals or bond pads of a second plurality.

By way of example, a routing element of the present invention may be used to simultaneously provide the conductive paths. Accordingly, such a routing element may be positioned at least partially over one or both of a location of the substrate and a semiconductor device thereon such that first ends of the conductive traces of the routing element thereon are located proximate to corresponding terminals or bond pads of the first plurality and second ends of the conductive traces are located proximate to corresponding terminals or bond pads of the second plurality. The terminals and/or bond pads may then be electrically connected to their corresponding conductive traces of the routing element.

The present invention also includes a method for designing a routing element. This method includes identifying a first plurality of terminals or bond pads and a remote, second plurality of terminals or bond pads that are to be electrically connected to one another. The locations of each terminal or bond pad of the first and second pluralities is then determined. Based on the locations of each corresponding pair or set of bond pads and/or terminals, the locations of contact pads and conductive traces of a routing element may be configured to facilitate connection of each corresponding pair of terminals and/or bond pads. The relative positions and orientations of the conductive trace locations may be configured to minimize electrical interference between adjacent conductive traces, with any structures of a substrate or semiconductor device that will underlie the conductive traces, or a combination thereof. In addition, the position of each conductive trace location, as well as the path of each conductive trace location, may be configured to minimize its length while still addressing the foregoing concerns.

Other features and advantages of the present invention will become apparent to those of ordinary skill in the art through consideration of the ensuing description, the accompanying drawings, and the appended claims.

BRIEF DESCRIPTION OF THE SEVERAL VIEWS OF THE DRAWINGS

In the drawings, which illustrate exemplary embodiments of various aspects of the present invention.

DETAILED DESCRIPTION OF THE INVENTION

Figure 1:
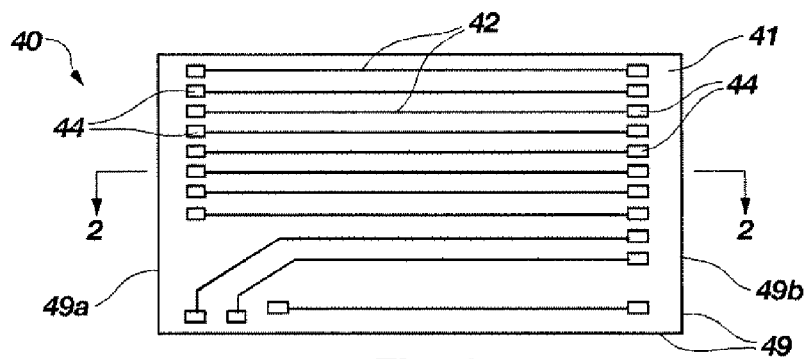
FIG. 1 is a top view of an exemplary routing element of the present invention.
Figure 2:
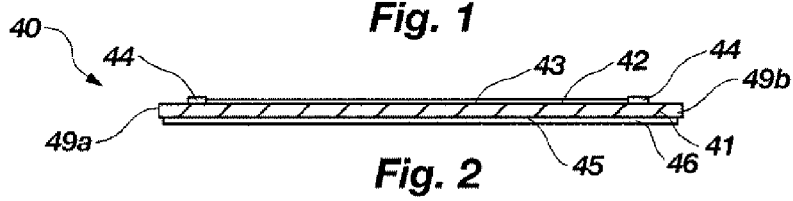
FIG. 2 is a cross-section taken along line 2-2 of FIG. 1.

With reference to FIGS. 1 and 2, an exemplary routing element 40 is depicted. Routing element 40 includes a thin base substrate 41, a plurality of conductive traces 42 carried by and extending across base substrate 41, and contact pads 44 located at ends of each conductive trace 42.

Base substrate 41 of routing element 40 may be formed from a dielectric material, such as a nonconductive polymer (e.g., polyimide). In addition, base substrate 41 may comprise a flexible, substantially planar member, enabling base substrate 41 to conform somewhat to surfaces that are located at different elevations (e.g., the different elevations of a multichip module). Alternatively, base substrate 41 may comprise a substantially planar member formed from any other dielectric material (e.g., glass, ceramic, etc.) or at least partially dielectric-coated semiconductor material.

Figure 7:
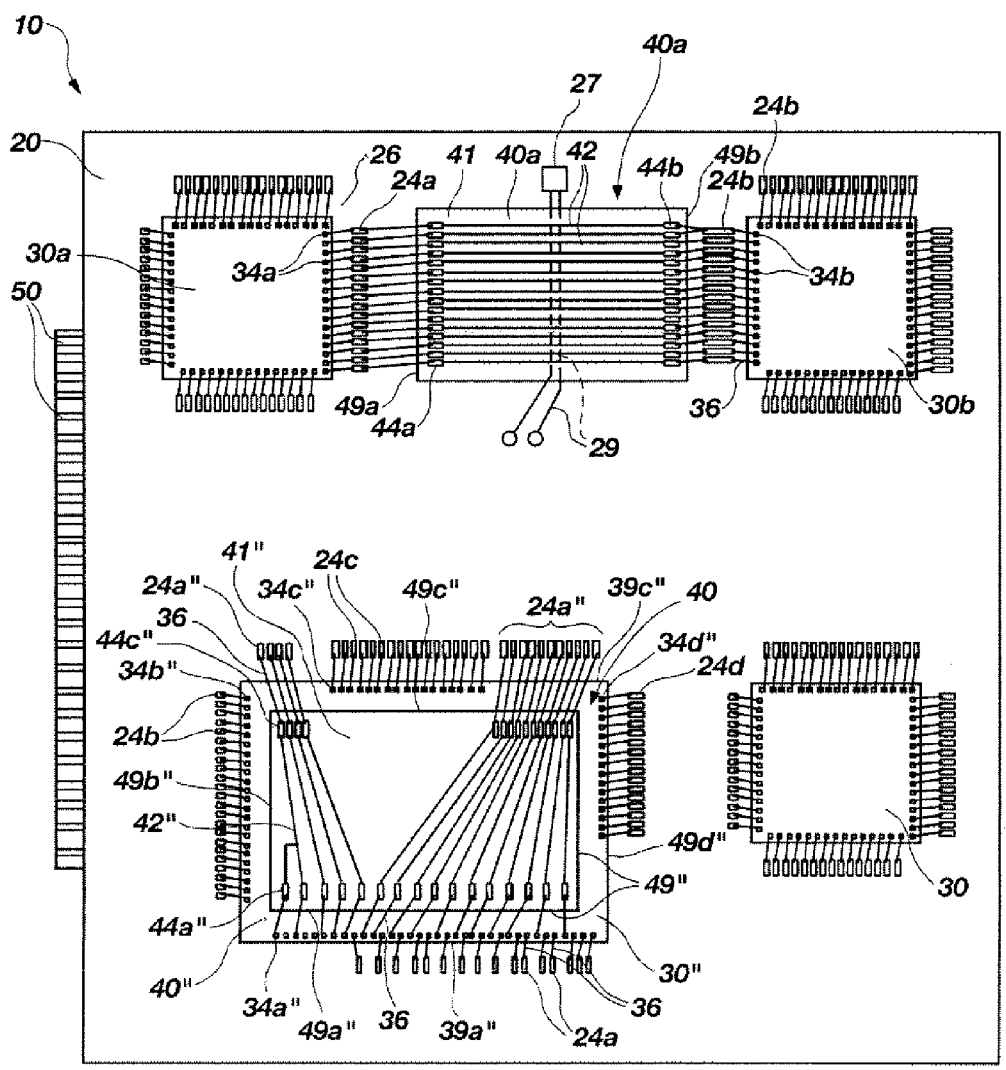
FIG. 7 is a top view of an exemplary multichip module which employs two routing elements according to the present invention in different ways.

Each conductive trace 42, which may be formed from a low electrical resistance, electrically conductive material, such as aluminum or copper, extends from a location proximate a first edge 49a of base substrate 41 to a location proximate a different, second edge 49b of base substrate 41. While conductive traces 42 may be nonlinear, it is preferred that each conductive trace 42 provide the shortest possible pathlength between a corresponding first terminal 24a (FIG. 7) or bond pad 34a (FIG. 7) and second terminal 24b or bond pad 34b (FIG. 7). Accordingly, substantially straight conductive traces 42 are within the scope of the present invention.

Conductive traces 42 are preferably positioned, oriented, and spaced on base substrate 41 relative to one another in such a manner as to reduce or eliminate any electrical interference therebetween. Conductive traces 42 of routing element 40 may be parallel or nonparallel to one another.

While conductive traces 42 may be carried on either side 43, 45 (FIG. 2) of base substrate 41, internally within base substrate 41, or with both internal and exposed portions, it is preferred that a back side 45 of base substrate 41 provide an electrically insulative barrier for conductive traces 42 to electrically isolate conductive traces 42 from any conductive structures that will underlie routing element 40 upon positioning of routing element 40 in use.

Contact pads 44 are carried upon either an upper side 43 of base substrate 41 at or adjacent to a peripheral edge 49 thereof or on peripheral edge 49 (FIG. 1). Such positioning of contact pads 44 facilitates access thereto by equipment that will secure discrete conductive elements 36 (FIG. 7) to contact pads 44 (e.g., a wire bonding capillary, thermocompression bonding equipment, etc.).

At least portions of back side 45 of base substrate 41 may be coated with an adhesive material 46 (FIG. 2), such as a thermoset resin or a pressure-sensitive adhesive. Such a coating of adhesive material 46 may facilitate securing of routing element 40 to one or more other structure or structures, such as a carrier substrate, a semiconductor device, or both. Adhesive material 46 may also electrically insulate conductive traces 42 and contact pads 44 from underlying structures, or provide an additional insulative layer or stand-off distance that decreases or eliminates any electrical interference that may occur between underlying structures and conductive traces 42 or contact pads 44.

Figure 3:
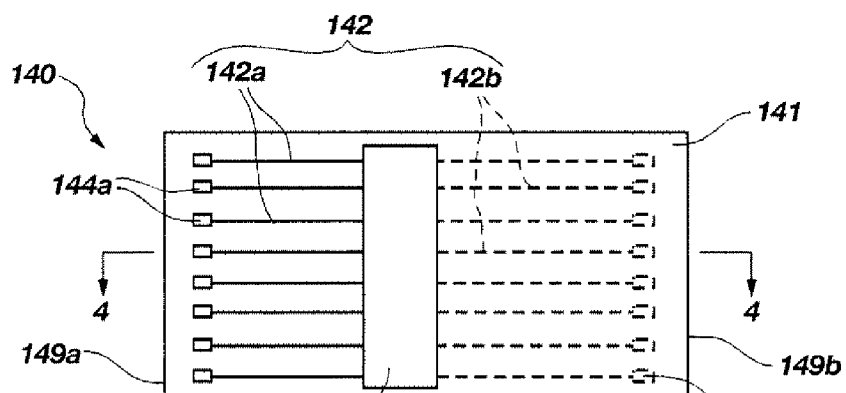
FIG. 3 is a top view of another exemplary routing element.
Figure 4:
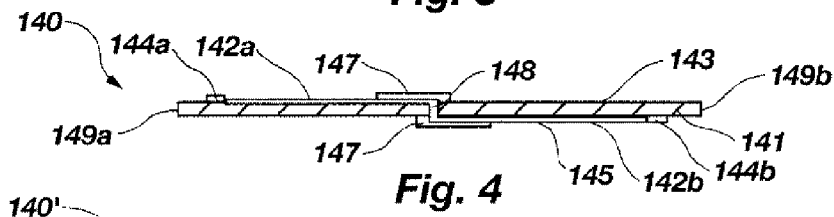
FIG. 4 is a cross-section taken along line 4-4 of FIG. 3.

Another embodiment of a routing element 140 is shown in FIGS. 3 and 4. Routing element 140 includes a substrate 141 and conductive traces 142, and contact pads 144a, 144b that are carried by substrate 141.

Contact pads 144*a* are located adjacent to a first peripheral edge 149*a* of substrate 141, while contact pads 144*b* are located adjacent to a different peripheral edge 149*b* of substrate 141. In addition, contact pads 144*a* are exposed at a first side 143 of substrate 141, while contact pads 144*b* are exposed at an opposite side 145 thereof. Contact pads 144*a*, 144*b* are positioned adjacent to and communicate with ends of each conductive trace 142.

Each conductive trace 142 includes a first portion 142*a* and a second portion 142*b*. First and second portions 142*a* and 142*b* of each conductive trace 142 communicate with each other. By way of example, if first and second portions 142*a* and 142*b* are carried upon opposite sides 143, 145 of substrate 141, first and second portions 142*a* and 142*b* of each conductive trace 142 may be electrically connected to one another by way of an electrically conductive via 148. One or more regions along the lengths of first and second portions 142*a* and 142*b* may be coated with a dielectric material 147 to electrically insulate these portions from any structures that may contact the same in use.

Figure 5:
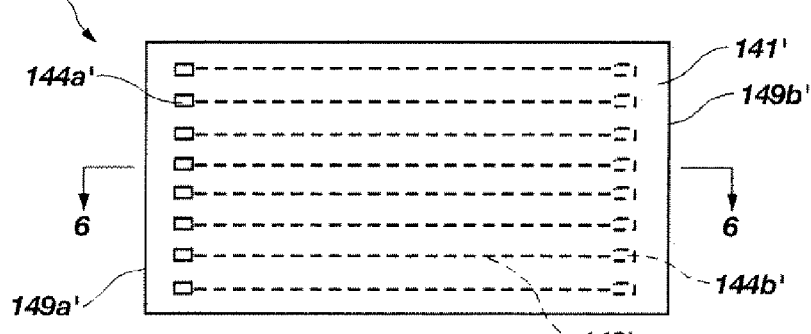
FIG. 5 is a top view of still another exemplary routing element that incorporates teachings of the present invention.
Figure 6:
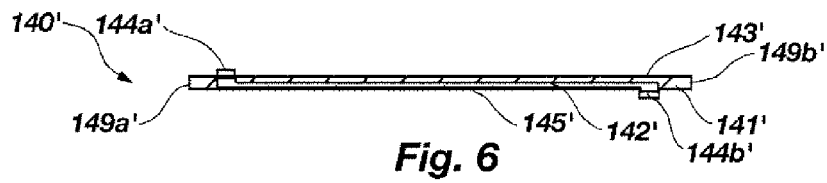
FIG. 6 is a cross-section taken along line 6-6 of FIG. 5.

Another exemplary embodiment of routing element 140' incorporating teachings of the present invention is depicted in FIGS. 5 and 6. Routing element 140' includes a substrate 141', as well as conductive traces 142' and contact pads 144*a*' and 144*b*' that are carried by substrate 141'.

At least a portion of the length of each conductive trace 142' of routine element 140' is carried internally within substrate 141'. Therefore, substrate 141' substantially electrically insulates the internalized portion of each conductive trace 142'. Contact pads 144*a*' and 144*b*' facilitate communication with conductive traces 142'. A first contact pad 144*a*' is positioned at a first end of each conductive trace 142', while a second contact pad 144*b*' is located at a second end of each conductive trace 142'. Contact pads 144*a*' are located adjacent to a different peripheral edge 149*a*' of substrate 141' than the peripheral edge 149*b*' near which contact pads 144*b*' are located. In addition, contact pads 144*a*' and 144*b*' are positioned on opposite sides 143', 145' of substrate 141'.

In designing a routing element according to the present invention, several factors may be considered. For example, the locations of each of the terminals or bond pads of a multichip module between which a conductive trace of the routing element is to provide a conductive path may be considered. In addition, the shapes, locations, orientations, and positions of the conductive traces may be configured to minimize the lengths thereof, to reduce or eliminate the potential for interference between the conductive traces of the routing element or between the conductive traces and features that are external to the routing element, or a combination thereof. Further, the manner in which the conductive traces or portions thereof are carried by the substrate (i.e., internally or externally) may be configured based on the types of structures that will, in use of the designed routing element, be located adjacent thereto. The routing element may also be configured to include insulative coatings on portions or all of the conductive traces thereof. Contact pads of a routing element may be configured based on the type of electrical connection that will be used therewith (e.g., wire bonding, tape-automated bond (TAB) elements carried by a polymeric film, thermocompression bonded leads, use of solder balls, etc.).

Turning now to FIG. 7, an exemplary embodiment of a multichip module 10 is illustrated. Multichip module 10 includes a MCM substrate 20, which is also referred to herein as a carrier substrate, and semiconductor devices 30 that are secured to MCM substrate 20. As used herein, the term "semiconductor device" includes, without limitation, semiconductor dice, as well as full or partial wafers or other large-scale semiconductor substrates upon which a number of semiconductor dice are fabricated. Routing elements 40 may be positioned over portions of one or both of MCM substrate 20 and semiconductor devices 30. In addition, multichip module 10 may include one or more passive devices 27, such as capacitors, resistors, batteries, indicators, and the like. These passive devices 27 may be electrically connected to MCM substrate 20 and/or one or more semiconductor devices 30 by way of conductive traces 29 carried by MCM substrate 20, routing elements 40, or a combination thereof.

Multichip module 10 may also include one or more external connective elements 50, which facilitate communication between semiconductor devices 30 or other electronic components of multichip module 10 and componentry, such as a motherboard or other higher level packaging, external to multichip module 10. Although external connective elements 50 are depicted as plug-in type edge connectors, other types of external connective elements are also within the scope of the present invention, including, without limitation, balls, bumps, pillars, and columns of electrically conductive material (e.g., solder, other metals, conductive epoxy, conductor-filled epoxy, z-axis conductive elastomer, etc.), as well as conductive pins.

MCM substrate 20 may comprise a circuit board or any other type of substrate that may be used in multichip modules. By way of example only, a circuit board that includes two or four wiring layers may be used as MCM substrate 20. MCM substrate 20 includes die attach locations 26 on at least one side thereof. MCM substrate 20 also carries conductive traces (not shown) and their corresponding terminals 24*a*, 24*b* (hereinafter collectively referred to as "terminals 24"), as well as terminals 24 that do not correspond to any conductive traces.

Conductive traces may extend across one or more layers of MCM substrate 20, as well as vertically through MCM substrate 20, between different wiring layers thereof. Each conductive trace facilitates the communication of electrical signals between at least first and second locations of MCM substrate 20, such as die attach locations 26 thereof, which locations correspond to the two ends of each conductive trace. At least one of the first and second locations between which each conductive trace extends may be positioned proximate a die attach location 26 of MCM substrate 20.

A terminal 24 is located at each end of each conductive trace. Terminals 24 facilitate the electrical connection of each conductive trace to another, corresponding terminal 24 carried by MCM substrate 20 or to a corresponding bond pad 34 of a semiconductor device 30 on MCM substrate 20.

Each semiconductor device 30 may be secured to a corresponding die attach location 26 of MCM substrate 20. Discrete conductive elements 36, such as bond wires, TAB elements, thermocompression bonded leads, or the like, may electrically connect and, thus, establish communication between bond pads 34 of each semiconductor device 30 and their corresponding terminals 24 and, thus, corresponding conductive traces carried by MCM substrate 20. Both bond pads 34 and terminals 24 are also referred to herein as contact areas.

Alternatively, discrete conductive elements 36 may connect bond pads 34 of semiconductor devices 30 or terminals 24 of MCM substrate 20 to corresponding contact pads 44 (e.g., contact pads 44*a*, 44*a*", 44*b* of FIG. 7) of a routing element 40 positioned adjacent thereto. The connected bond pads 34 or terminals 24 may then communicate with corresponding, remote bond pads 34 or terminals 24 by way of conductive traces 42 of routing element 40.

As depicted in FIG. 7, as a first example of the placement and use of a routing element 40 in multichip module 10, a routing element 40a may be positioned over a region of MCM substrate 20 that is located between two semiconductor devices 30a and 30b. Bond pads 34a of semiconductor device 30a may be electrically connected to, or communicate with, corresponding terminals 24a of MCM substrate 20 by way of discrete conductive elements 36. Discrete conductive elements 36 may also electrically connect, or establish communication between, terminals 24a and corresponding contact pads 44a of routing element 40a. Each contact pad 44a of routing element 40a extends substantially across base substrate 41 thereof to another contact pad 44b located proximate an opposite edge 49b of base substrate 41 from its corresponding contact pad 44a. Contact pads 44b are also electrically connected to, or communicate with, corresponding terminals 24b by way of discrete conductive elements 36. Additional discrete conductive elements 36 are positioned between each terminal 24b of MCM substrate 20 and a corresponding bond pad 34b of semiconductor device 30b. This series of discrete conductive elements 36 and conductive traces 42 establishes electrical communication between each first bond pad 34a and its corresponding second bond pad 34b.

Figure 8:
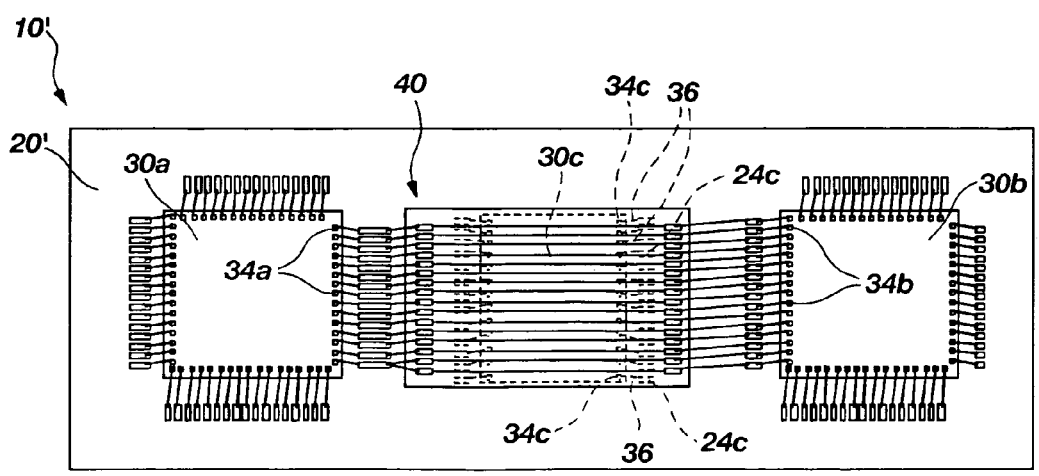
FIG. 8 is a top view of another multichip module that includes a routing element superimposed and extending over a semiconductor device.

FIG. 8 depicts an alternative embodiment of multichip module 10', which includes a MCM substrate 20', semiconductor devices 30a, 30b, and a routing element 40 that are similar to those described herein with reference to FIG. 7. In addition, multichip module 10' includes another semiconductor device 30c. Discrete conductive elements 36 electrically connect bond pads 34c of semiconductor device 30c to corresponding terminals 24c of MCM substrate 20'.

Again, discrete conductive elements 36 and features of routing element 40 electrically connect bond pads 34a of semiconductor device 30a to corresponding bond pads 34b of semiconductor device 30b. Rather than extend only over a portion of MCM substrate 20', however, routing element 40 is also superimposed over semiconductor device 30 and over at least some discrete conductive elements 36 that electrically connected bond pads 34c thereof to their corresponding terminals 24c.

With reference again to FIG. 7, another example of the placement and use of a routing element 40" in multichip module 10 is depicted. In this example, an entire routing element 40" may be positioned over a portion of a semiconductor device 30". Bond pads 34a"-34d" of semiconductor device 30" are exposed beyond an outer periphery 49" (which includes edges 49a"-49d") of a base substrate 41" of routing element 40". As depicted, routing element 40" is used to electrically connect and establish communication between bond pads 34a" positioned proximate a first edge 39a" of semiconductor device 30" and corresponding terminals 24a" located adjacent another edge 39c" of semiconductor device 30". Discrete conductive elements 36 electrically connect a bond pad 34a" to an adjacently positioned, corresponding contact pad 44a" of routing element 40". Likewise, a corresponding contact pad 44c", located at an opposite end of conductive trace 42" from contact pad 44a", may be electrically connected to a corresponding terminal 24a" by way of a discrete conductive element 36.

Remaining bond pads 34a"-34d" of semiconductor device 30" may also be electrically connected to adjacent, corresponding terminals 24a-24d of MCM substrate 20 by way of discrete conductive elements 36 that extend from bond pads 34a"-34d", over edges 39a"-39d", to terminals 24a-24d. Terminals 24a-24d, in turn, facilitate communication with semiconductor devices or other electronic components located elsewhere on MCM substrate 20, or with componentry that is external to multichip module 10.

Figure 9:
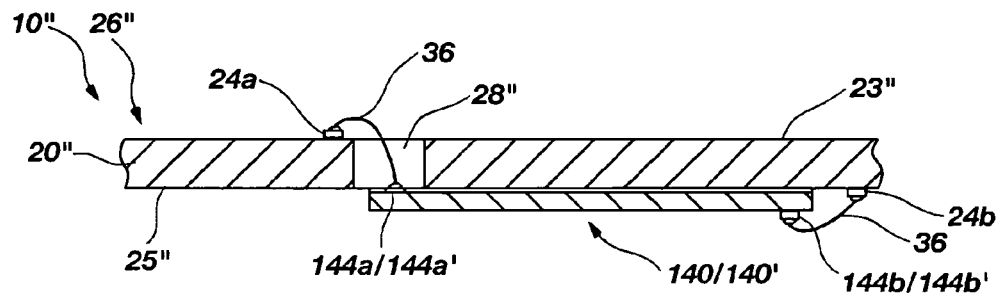
FIG. 9 is a cross-sectional representation of yet another multichip module of the present invention, illustrating the use of an aperture to electrically connect terminals on one side of a substrate to corresponding contact pads of a routing element on the opposite side of the substrate.

Referring now to FIG. 9, another embodiment of multichip module 10" is depicted. MCM substrate 20" of multichip module 10" includes at least one aperture 28" formed therethrough. Aperture 28" is located adjacent to one or both of a group of terminals 24a and a die mounting location 26" on a first side 23" of MCM substrate 20".

A routing element 140, 140' is positioned on an opposite, second side 25" of MCM substrate 20" so as to overlap at least a portion of aperture 28", with a first group of contact pads 144a, 144a' thereof being exposed through aperture 28". A second group of contact pads 144b, 144b' of routing element 140, 140' are positioned proximate to corresponding terminals 24b of MCM substrate 20" and/or bond pads 34b of a semiconductor device 30 (FIG. 7) on second side 25" of MCM substrate 20". Discrete conductive elements 36 extend through aperture 28", or otherwise through a plane of MCM substrate 20", to electrically connect terminals 24a on first side 23" to contact pads 144a, 144a'. Contact pads 144b, 144b' are also electrically connected to corresponding terminals 24b or bond pads 34b (FIG. 7) on second side 25" by way of discrete conductive elements 36.

Figure 10:
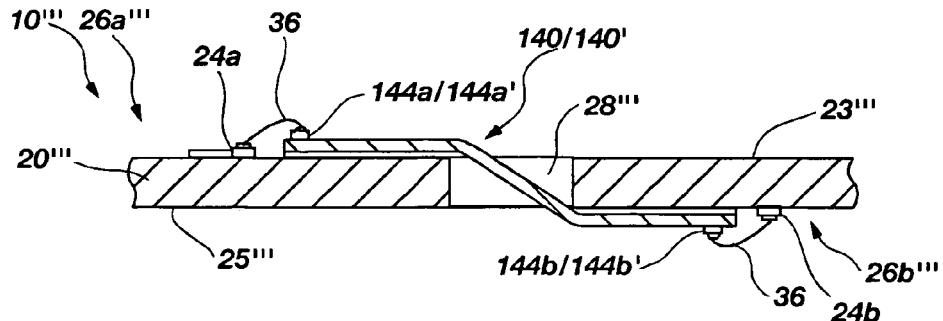
FIG. 10 is a cross-sectional representation of a multichip module that includes a routing element extending from a first side of the substrate thereof, through an aperture, to a second side of the substrate thereof.

The multichip module 10'" shown in FIG. 10 includes a MCM substrate 20'" with an aperture 28'" formed therethrough at an intermediate location between a first group of terminals 24a or a first die attach region 26a'" on a first side 23'" thereof and a second group of terminals 24b or a second die attach region 26b'" on an opposite, second side 25'" thereof.

A routing element 140, 140' extends through aperture 28'", with a first group of contact pads 144a, 144a' thereof being positioned proximate to one or both of terminals 24a of the first group and bond pads of a semiconductor device 10'" secured to die attach region 26a'". A second group of contact pads 144b, 144b', which are located at an opposite end of routing element 140, 140', are positioned proximate to one or both of terminals 24b or the second group and bond pads of a semiconductor device 10'" secured to die attach region 26b'". While connections between contact pads 144a, 144a', 144b, 144b' and their respective, corresponding terminals 24a, 24b or bond pads (not shown) are depicted as being made by way of discrete conductive elements 36 in the form of wire bonds. other types of discrete conductive elements 36, including, without limitation, TAB elements and thermocompression bonded leads, may be used to electrically connect contact pads 144a, 144b to terminals 24a, 24b or bond pads (not shown) that are facing in the same general direction.

Alternatively, contact pads 44a, 44b, 144a, 144b of any routing element (e.g., routing elements 40, 40a, 40", 140, 140') incorporating teachings of the present invention may be positioned on top of their corresponding terminals 24a, 24b or bond pads (not shown) to facilitate bonding thereto by way of discrete conductive elements 36, such as thermocompression bonded leads, solder balls, or the like.

Although the foregoing description contains many specifics, these should not be construed as limiting the scope of the present invention, but merely as providing illustrations of some exemplary embodiments. Similarly, other embodiments of the invention may be devised which do not depart from the spirit or scope of the present invention. Features from different embodiments may be employed in combination. The scope of the invention is, therefore, indicated and limited only by the appended claims and their legal equiva-

What is claimed:

1. A semiconductor device assembly, comprising:
   a substrate;
   a polymeric film extending through the substrate, at least a portion of a surface of the polymeric film carrying at least one conductive trace for establishing communication between a first contact pad and a second contact pad; and
   a plurality of semiconductor devices positioned at different locations on the substrate, the polymeric film being secured to the substrate laterally between at least two semiconductor devices of the plurality of semiconductor devices.

2. The semiconductor device assembly of claim 1, wherein the at least one conductive trace at least partially establishes communication between at least one of a terminal of the substrate and a bond pad of at least one semiconductor device of the plurality of semiconductor devices.

3. The semiconductor device assembly of claim 2, wherein communication between the bond pad or the terminal is further established by at least one discrete conductive element positioned electrically between the at least one conductive trace and the bond pad or the terminal.

4. The semiconductor device assembly of claim 1, wherein the polymeric film is at least partially superimposed over at least one semiconductor device of the plurality of semiconductor devices.

5. The semiconductor device assembly of claim 1, wherein at least one conductive trace carried by the polymeric film at least partially establishes communication between a bond pad of one of the at least two semiconductor devices and a corresponding bond pad of another of the at least two semiconductor devices.

6. The semiconductor device assembly of claim 5, wherein the at least one conductive trace communicates with a terminal of the substrate which, in turn, communicates with the bond pad.

7. The semiconductor device assembly of claim 6, further comprising:
   a discrete conductive element between the terminal and the at least one conductive trace; and
   another discrete conductive element between the terminal and the bond pad.

8. The semiconductor device assembly of claim 6, wherein another bond pad of at least one semiconductor device is in communication with at least a terminal of the substrate by way of another conductive trace carried by the polymeric film.

9. The semiconductor device assembly of claim 1, wherein the substrate comprises at most four conductive layers.

10. The semiconductor device assembly of claim 1, wherein the at least one conductive trace provides a more direct electrical route between the first contact pad and the second contact pad than any conductive trace carried by the substrate.

11. The semiconductor device assembly of claim 1, wherein opposite ends of the at least one conductive trace are electrically exposed at opposite surfaces of the polymeric film.

12. The semiconductor device assembly of claim 1, wherein opposite ends of the at least one conductive trace arc electrically exposed at the same surface of the polymeric film.

* * * * *

UNITED STATES PATENT AND TRADEMARK OFFICE
CERTIFICATE OF CORRECTION

| | |
|---|---|
| PATENT NO. | : 7,372,138 B2 |
| APPLICATION NO. | : 11/080586 |
| DATED | : May 13, 2008 |
| INVENTOR(S) | : Corisis et al. |

Page 1 of 1

It is certified that error appears in the above-identified patent and that said Letters Patent is hereby corrected as shown below:

In column 10, line 32, in Claim 12, delete "arc" and insert -- are --, therefor.

Signed and Sealed this

Twenty-sixth Day of August, 2008

JON W. DUDAS
*Director of the United States Patent and Trademark Office*